United States Patent
Chou et al.

(10) Patent No.: US 9,755,113 B2
(45) Date of Patent: Sep. 5, 2017

(54) LIGHT EMITTING DEVICE

(71) Applicant: InterLight Optotech Corporation, Yangmei, Taoyuan County (TW)

(72) Inventors: Hsi-Yan Chou, Taoyuang (TW); Tzu-Chi Cheng, Taoyuang (TW)

(73) Assignee: INTERLIGHT OPTOTECH CORPORATION, Yangmei, Taoyuan County (TW)

( * ) Notice: Subject to any disclaimer, the term of this patent is extended or adjusted under 35 U.S.C. 154(b) by 7 days.

(21) Appl. No.: 15/198,453

(22) Filed: Jun. 30, 2016

(65) Prior Publication Data
US 2016/0315228 A1      Oct. 27, 2016

Related U.S. Application Data

(63) Continuation of application No. 13/340,169, filed on Dec. 29, 2011.

(51) Int. Cl.
| | |
|---|---|
| *F21V 33/00* | (2006.01) |
| *H01L 33/48* | (2010.01) |
| *F21K 9/00* | (2016.01) |
| *H01L 25/075* | (2006.01) |
| *H01L 33/50* | (2010.01) |

(Continued)

(52) U.S. Cl.
CPC ............ *H01L 33/483* (2013.01); *F21K 9/00* (2013.01); *H01L 25/0753* (2013.01); *H01L 27/153* (2013.01); *H01L 33/50* (2013.01); *H01L 33/58* (2013.01); *H01L 33/62* (2013.01); *F21V 5/04* (2013.01); *F21Y 2105/10* (2016.08); *F21Y 2105/12* (2016.08); *F21Y 2113/13* (2016.08); *F21Y 2115/10* (2016.08); *H01L 2224/16225* (2013.01); *H01L 2224/48091* (2013.01); *H01L 2224/48137* (2013.01);

(Continued)

(58) Field of Classification Search
CPC .......... F21V 9/16; F21S 10/02; H01L 33/483; H01L 27/153; H01L 33/58; H01L 33/62
USPC ...... 362/234, 235, 236, 240, 249.02, 84, 231
See application file for complete search history.

(56) References Cited

U.S. PATENT DOCUMENTS

| | | |
|---|---|---|
| 7,316,497 B2 | 1/2008 | Rutherford et al. |
| 7,318,651 B2 | 1/2008 | Chua et al. |

(Continued)

FOREIGN PATENT DOCUMENTS

| | | |
|---|---|---|
| CN | 200979881 Y | 11/2007 |
| CN | 201225532 Y | 4/2009 |

(Continued)

*Primary Examiner* — Bryon T Gyllstrom
(74) *Attorney, Agent, or Firm* — Muncy, Geissler, Olds & Lowe, P.C.

(57) ABSTRACT

A light emitting device includes a base, a first light emitting unit, a second light emitting unit, a light conversion layer and a lens. The base has a first side slot, a second side slot, and a central slot separated from the first side slot and the second side slot, and the first side slot is formed in a separated recess configuration with a long axis and a short axis. The first light emitting unit is installed in the central slot, and the second light emitting unit is installed in the first side slot. The light conversion layer is covered onto the first light emitting unit or the second light emitting unit, and the lens covers the light conversion layer, the central slot, the first side slot, and the second side slot. The first slot and the lens have first similar contour lines in a top view.

20 Claims, 5 Drawing Sheets

(51) Int. Cl.
    *H01L 33/58*     (2010.01)
    *H01L 27/15*     (2006.01)
    *H01L 33/62*     (2010.01)
    *F21V 5/04*     (2006.01)
    *F21Y 105/12*     (2016.01)
    *F21Y 105/10*     (2016.01)
    *F21Y 115/10*     (2016.01)
    *F21Y 113/13*     (2016.01)

(52) U.S. Cl.
    CPC ............... *H01L 2224/48227* (2013.01); *H01L 2924/0002* (2013.01); *H01L 2924/181* (2013.01)

(56) References Cited

U.S. PATENT DOCUMENTS

| | | | |
|---|---|---|---|
| 7,821,023 B2* | 10/2010 | Yuan | H05B 33/0821 257/80 |
| 7,821,194 B2* | 10/2010 | Negley | F21K 9/00 313/498 |
| 7,832,895 B2 | 11/2010 | Sumitani et al. | |
| 7,842,526 B2 | 11/2010 | Hadame | |
| 7,857,457 B2 | 12/2010 | Rutherford et al. | |
| 2004/0070333 A1 | 4/2004 | Lin et al. | |
| 2004/0217364 A1* | 11/2004 | Tarsa | H01L 25/0753 257/89 |
| 2005/0127816 A1 | 6/2005 | Sumitani | |
| 2005/0255031 A1 | 11/2005 | Jung et al. | |
| 2006/0261366 A1* | 11/2006 | Yang | H01L 33/58 257/100 |
| 2007/0246717 A1* | 10/2007 | Ng | H01L 33/486 257/81 |
| 2007/0268694 A1* | 11/2007 | Bailey | G02B 27/0955 362/231 |
| 2008/0035938 A1 | 2/2008 | Mazzochette | |
| 2008/0055900 A1 | 3/2008 | Budike, Jr. | |
| 2008/0186702 A1 | 8/2008 | Camras et al. | |
| 2008/0259598 A1* | 10/2008 | Sumitani | H01L 25/0753 362/231 |
| 2009/0189177 A1 | 7/2009 | Lee et al. | |
| 2009/0262526 A1 | 10/2009 | Lin et al. | |
| 2010/0103660 A1* | 4/2010 | van de Ven | H01L 25/0753 362/231 |
| 2010/0220475 A1* | 9/2010 | Park | G02B 5/1876 362/231 |
| 2010/0290221 A1 | 11/2010 | Tarsa et al. | |
| 2010/0296265 A1* | 11/2010 | Kim | F21S 8/08 362/84 |

FOREIGN PATENT DOCUMENTS

| | | |
|---|---|---|
| CN | 201490192 U | 5/2010 |
| CN | 101968169 A | 2/2011 |
| CN | 201820755 U | 5/2011 |
| DE | 10 2010 027 875 A1 | 10/2011 |
| JP | 2001-144331 A | 5/2001 |
| WO | WO 2005/091392 A1 | 9/2005 |
| WO | WO 2007/114614 A1 | 10/2007 |

\* cited by examiner

LIGHT EMITTING DEVICE

CROSS-REFERENCE TO RELATED APPLICATIONS

The present application is a Continuation of co-pending U.S. application Ser. No. 13/340,169, filed on Dec. 29, 2011, the disclosure of which is hereby incorporated by reference in its entirety.

FIELD OF THE INVENTION

The present invention relates to a light emitting device, in particular to a Multi-Cavities light emitting device capable of emitting a warm white light.

BACKGROUND OF THE INVENTION

With the features of low power consumption, good power-saving effect, long service life, small volume and quick response, light emitting diodes (LED) have gradually replaced traditional tungsten bulbs, fluorescent lamps or mercury lamps, and the LEDs are applied extensively in various types of lamps.

With reference to FIGS. 1 and 2 for a schematic planar view and a partial cross-sectional view of a conventional LED module respectively, the LED module 1a comprises a substrate 10a, a plurality of LED chips (such as blue LED chips) 20a, a fluorescent plastic (such as a yellow fluorescent plastic) 30a and a plurality of lenses 40a, wherein the substrate 10a includes a plurality of slots 11a arranged in a matrix, and the LED chips 20a are installed into the slots 11a respectively, and the fluorescent plastic 30a is filled into the slots 11a for covering the LED chips 20a and emitting a desired light color, and finally the lenses 40a are combined and formed onto the fluorescent plastic 30a and the LED chips 20a to seal each LED chip 20a. With the lens 40a, the light emitting efficiency of the LED chip 20a can be improved to provide a white light source.

In the foregoing structure, the lenses 40a are combined with the LED chips 20a one by one, so that the overall assembling time and cost will be increased. In addition, a large number of slots 11a are densely disposed, so that a substrate with a larger area is required, and the strength of the substrate 10a will be affected adversely, and the substrate 10a may be cracked or broken easily to result in a low yield rate.

In view of the drawbacks of the conventional LED module, the inventor of the present invention based on years of experience in the related industry to conduct extensive researches and experiments, and finally developed a feasible design to overcome the aforementioned drawbacks of the prior art.

SUMMARY OF THE INVENTION

Therefore, it is a primary objective of the present invention to provide a light emitting device to achieve the effects of improving the light extraction efficiency of an LED chip and the yield rate of the product and reducing the overall assembling time and cost.

To achieve the aforementioned objective, the present invention provides a light emitting device, including a base, a first light emitting unit, a second light emitting unit, a light conversion layer and a lens. The base has a first side slot, a second side slot, and a central slot separated from the first side slot and the second side slot, wherein the first side slot is formed in a separated recess configuration with a long axis and a short axis shorter than the long axis. The first light emitting unit is installed in the central slot, and the second light emitting unit is installed in the first side slot. The light conversion layer is covered onto the first light emitting unit or the second light emitting unit, and the lens covers the light conversion layer, the central slot, the first side slot, and the second side slot. The first slot and the lens have first similar contour lines when seen in a top view.

DESCRIPTION OF THE PREFERRED EMBODIMENTS

The technical characteristics and contents of the present invention will become apparent with the following detailed description and related drawings. The drawings are provided for the purpose of illustrating the present invention only, but not intended for limiting the scope of the invention.

Figure 1:
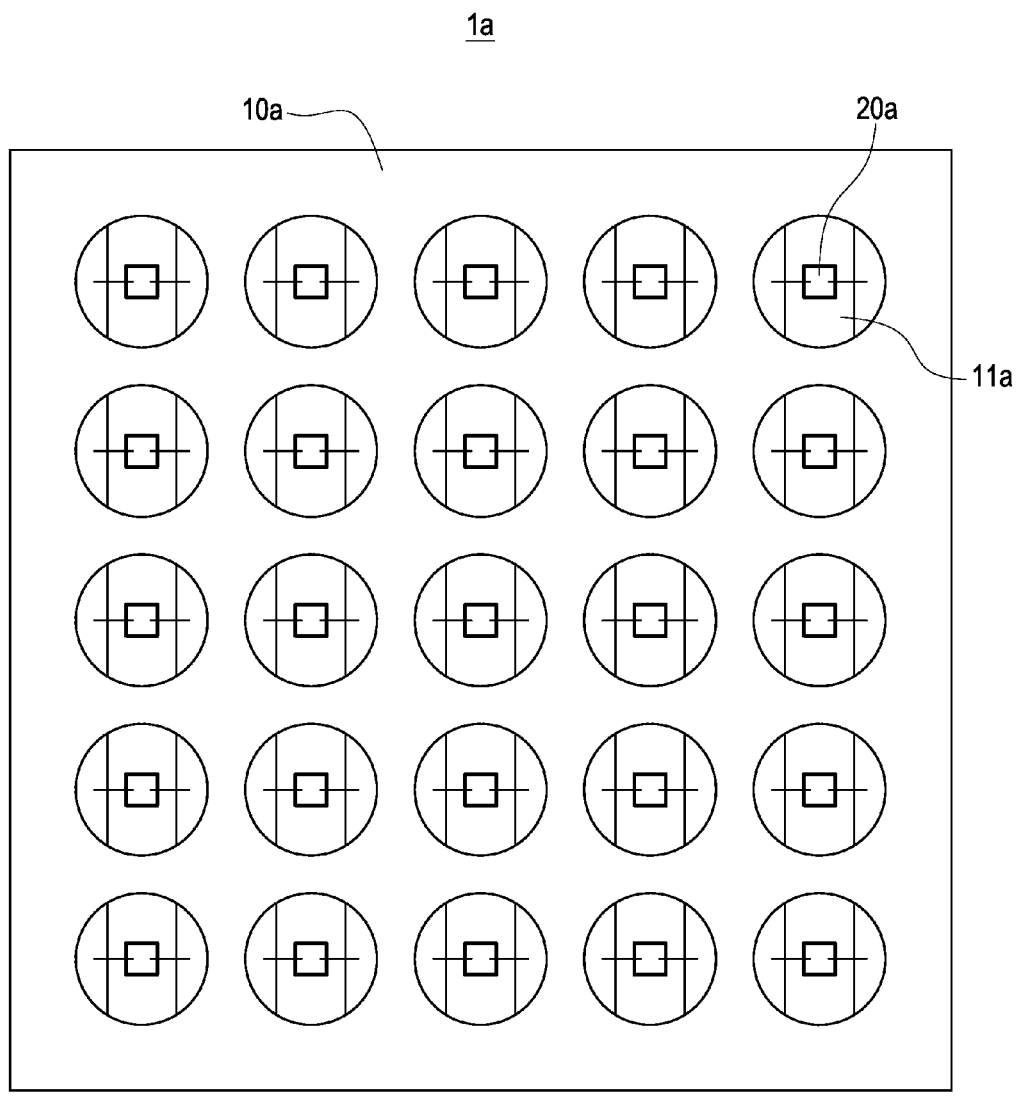
FIG. 1 is a schematic planar view of a conventional LED module.
Figure 2:
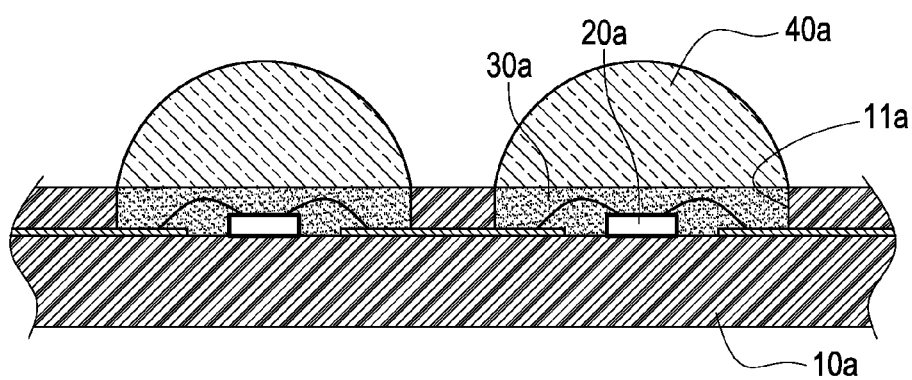
FIG. 2 is a partial cross-sectional view of a conventional LED module.
Figure 3:
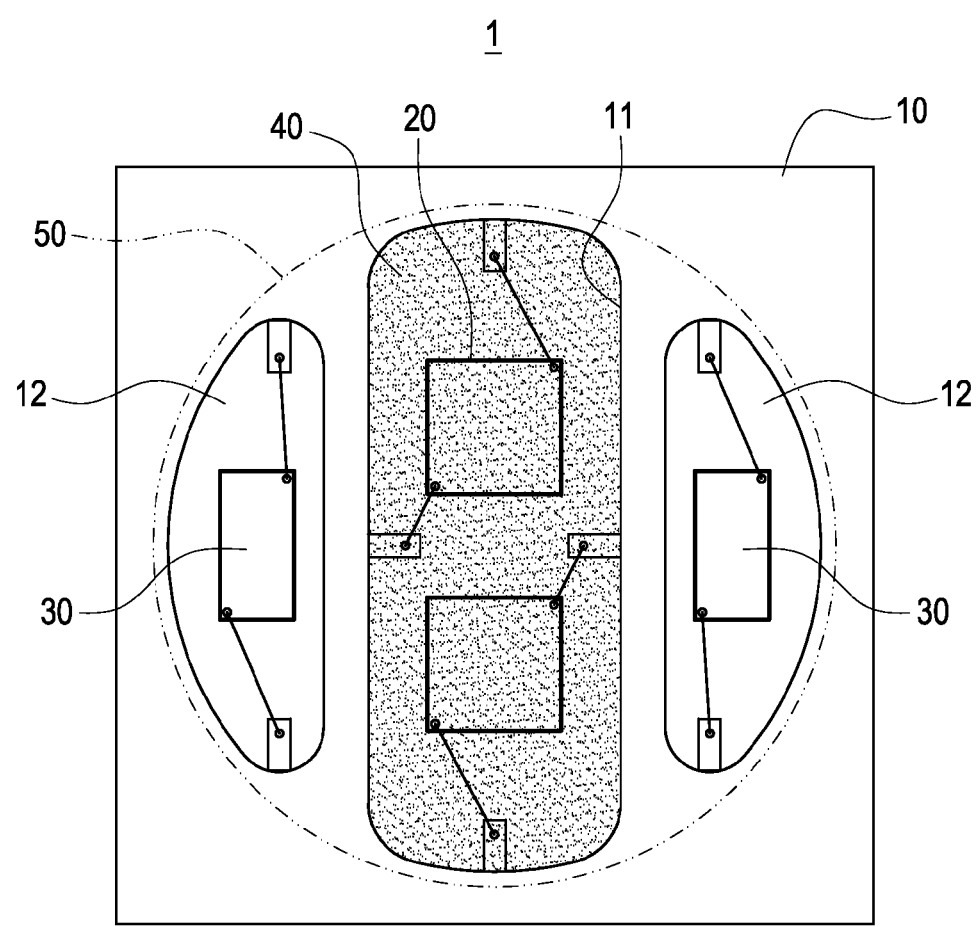
FIG. 3 is a schematic planar view of a Multi-Cavities light emitting device of the present invention.
Figure 4:
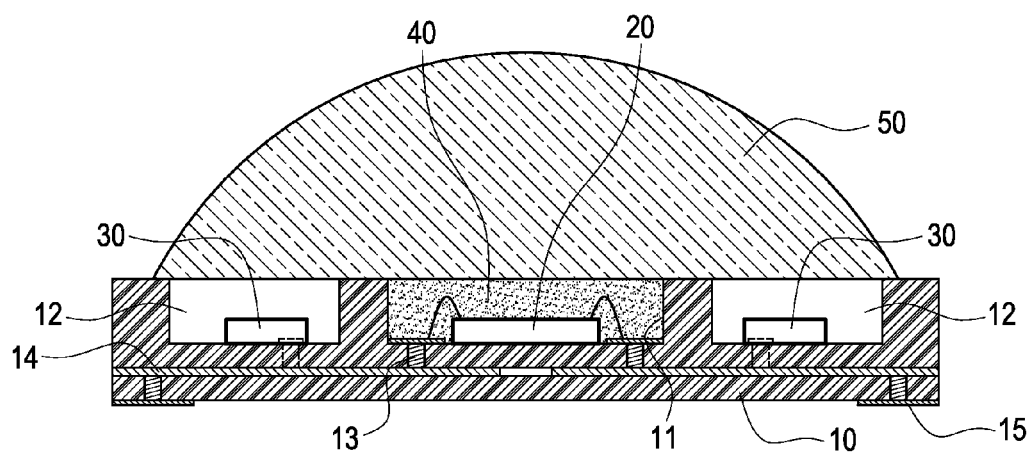
FIG. 4 is a cross-sectional view of a Multi-Cavities light emitting device of the present invention.

With reference to FIGS. 3 and 4 for a schematic planar view and a cross-sectional view of a Multi-Cavities light emitting device of the present invention respectively, the Multi-Cavities light emitting device 1 comprises a base 10, a first light emitting unit 20, at least two second light emitting units 30, a light conversion layer 40 and a lens 50.

The base 10 has a central slot 11 and at least two side slots 12 symmetrically formed on external sides of the central slot 11. The base 10 can be a ceramic base having a plurality of conductive holes 13 and an inner-layer circuit 14, but the invention is not limited to such arrangement only.

In this preferred embodiment, the first light emitting unit 20 is a blue light emitting unit, and each of the second light emitting units 30 is a red light emitting unit, and the central slot 11 and the side slots 12 are substantially in a long elliptical shape, and a gap between the central slot 11 and each of the side slots 12 is greater than 0.5 mm. In addition, the central slot 11 and the side slots 12 are formed in an area greater than 50% of the area of the base 10.

The first light emitting unit 20 is installed in the central slot 11, and the two second light emitting units 30 are installed into two corresponding side slots 12 respectively. The first light emitting unit 20 (which is the blue light emitting unit) and the second light emitting units 30 (which are the red light emitting units) are electrically coupled through the conductive holes 13 and the inner-layer circuit 14, and the substrate 10 includes a plurality of electric connecting pads 15 installed at the bottom of the substrate 10. In this preferred embodiment, the blue light emitting unit installed in the central slot 11 is a blue LED chip array, and the red light emitting units installed on both external sides of the blue light emitting unit are red LED chip arrays.

The light conversion layer 40 is a plastic layer containing a yellow or green phosphor, and the light conversion layer 40 is covered onto the first light emitting unit 20 (which is the blue light emitting unit). For example, yttrium aluminum garnet (YAG) is one of the yellow phosphors. After lights of the first light emitting unit 20 (which is the blue light emitting unit) and the second light emitting units 30 (which are the red light emitting units) covered with the light conversion layer 40 are collected, a warm white light is produced, wherein the warm white light has a color temperature range from 2700K to 4000K.

The lens 50 is protruded from the base for sealing the central slot 11 and the at least two side slots 12, and the lens 50 is made of resin, silicone, or epoxy resin, and a diffusion agent is added into the material of the lens to form the shape of a lens naturally, so as to enhance the light extraction and mix the lights emitted from the first light emitting unit 20 (which is the blue light emitting unit) and the second light emitting units 30 (which are the red light emitting units).

Figure 5:
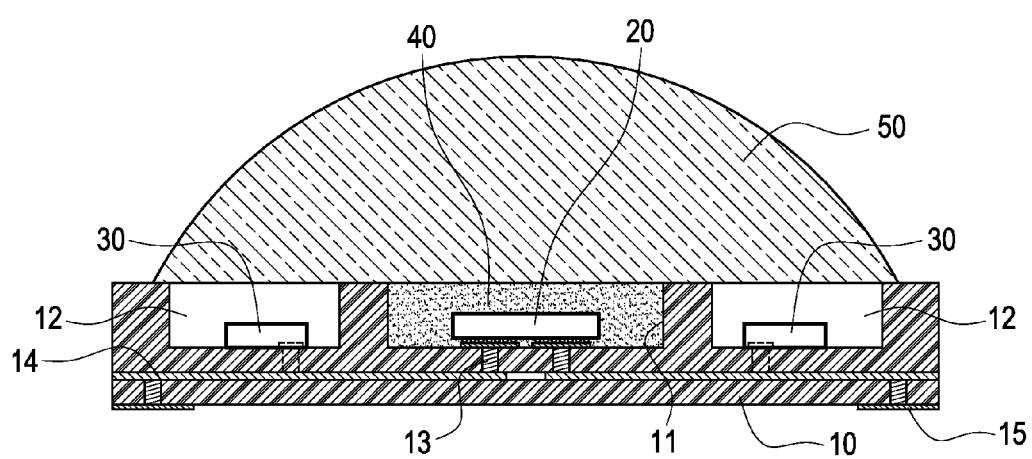
FIG. 5 is a cross-sectional view of a Multi-Cavities light emitting device in accordance with another embodiment of the present invention.

With reference to FIG. 5 for a cross-sectional view of a Multi-Cavities light emitting device in accordance with another embodiment of the present invention, the difference between FIG. 5 and FIG. 4 resides on that the blue light emitting unit 20 is combined into the central slot 11 by the method of a flip chip.

It is noteworthy to point out that the blue light emitting unit and the red light emitting unit can be interchangeable. In other words, the first light emitting unit 20 can be a red light emitting unit, and each of the second light emitting units 30 can be a blue light emitting unit. The red light emitting unit is installed in the central slot 11. On the other hand, the side slots 12 include the blue light emitting units installed therein respectively, and the side slots 12 are filled with the light conversion layers 40, and the light conversion layers 40 are disposed at positions corresponding to the blue light emitting units for covering the blue light emitting unit, and the lens 50 is provided for sealing the central slot 11 and side slots 12, so as to complete assembling the light emitting device 1.

Figure 6:
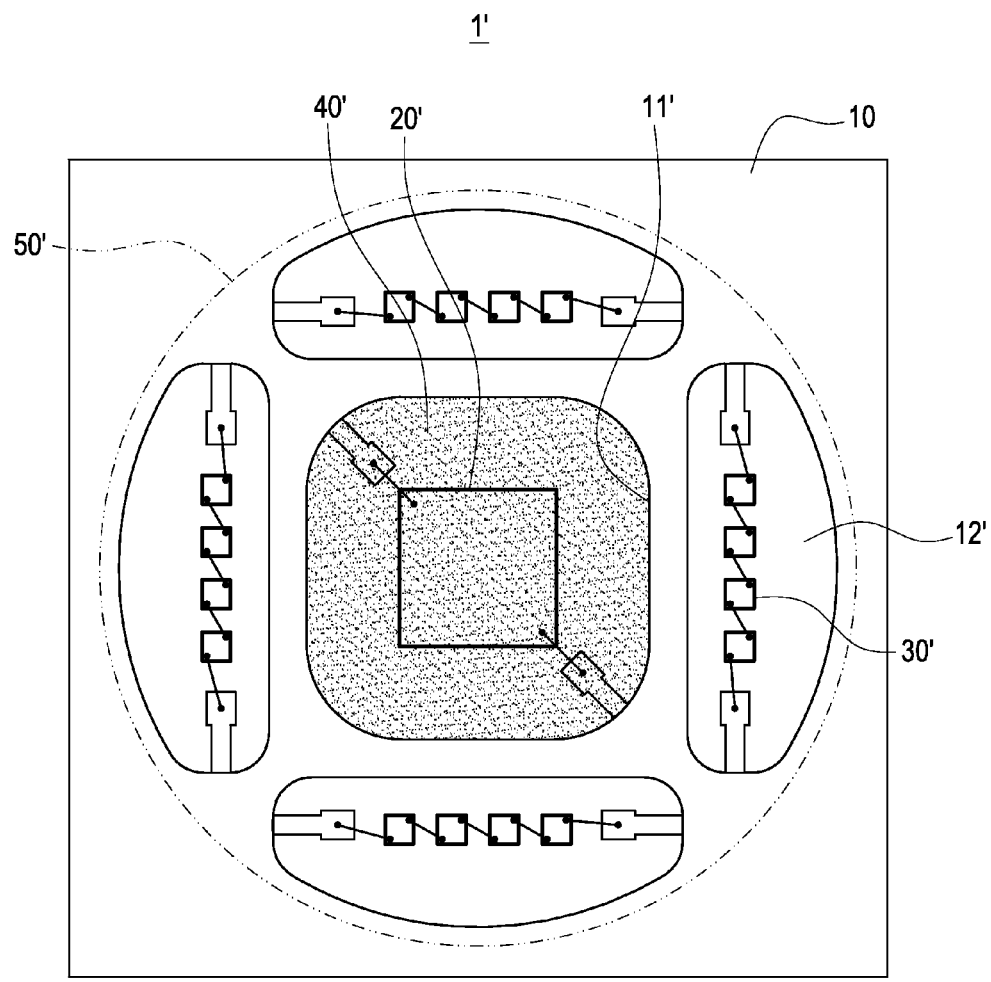
FIG. 6 is a cross-sectional view of another Multi-Cavities light emitting device in accordance with a further embodiment of the present invention.

With reference to FIG. 6 for a Multi-Cavities light emitting device in accordance with another preferred embodiment of the present invention, this preferred embodiment is substantially the same as the first preferred embodiment, and the light emitting device 1' of this preferred embodiment comprises a base 10', a first light emitting unit 20' (which is a blue light emitting unit), at least four second light emitting units 30' (which are red light emitting units), a light conversion layer 40' and a lens 50'. In this preferred embodiment, the base 10' has a central slot 11' and four side slots 12', and the side slots 12' are formed around external sides of the central slot 11', wherein each side slot 12' includes a second light emitting unit 30' installed therein, and each second light emitting unit 30' (which is the red light emitting unit) includes a plurality of red LED chips connected in series with each other, and the red light emitting unit can be substituted by a red LED array.

It is noteworthy to point out that in the use of the light emitting device 1, 1' of the present invention, the quantity and position of the second light emitting units 30' and the first light emitting units 20' are not limited, so that the desired brightness and color temperature can be adjusted flexibly.

While the invention has been described by means of specific embodiments, numerous modifications and variations could be made thereto by those skilled in the art without departing from the scope and spirit of the invention set forth in the claims.

What is claimed is:

1. A light emitting device, comprising:
    a base comprising:
        a first side slot;
        a second side slot; and
        a central slot separated from the first side slot and the second side slot, wherein the first side slot is formed in a separated recess configuration with a long axis and a short axis shorter than the long axis;
    a first light emitting unit, installed in the central slot;
    a second light emitting unit installed in first side slot;
    a light conversion layer, covered onto the first light emitting unit or the second light emitting unit; and
    a lens, comprising a curved surface which continuously covers the light conversion layer, the central slot, the first side slot, and the second side slot,
    wherein the first slot and the lens have first similar contour lines when seen in a top view.

2. The light emitting device of claim 1, wherein the central slot and the lens have second similar contour lines.

3. The light emitting device of claim 2, wherein the first similar contour lines are disconnected to the second similar contour lines.

4. The light emitting device of claim 1, wherein the first similar contour lines comprise a section with curved shape.

5. The light emitting device of claim 1, wherein the second side slot and the lens have third similar contour lines.

6. The light emitting device of claim 1, further comprising an electric connecting pad arranged at the base and separated from the first light emitting unit.

7. The light emitting device of claim 6, further comprising an inner-layer circuit separated from the electric connecting pad and electrically connected to the electric connecting pad and the first light emitting unit.

8. The light emitting device of claim 7, further comprising a first conductive hole connected to the inner-layer circuit and the first light emitting unit.

9. The light emitting device of claim 7, further comprising a second conductive hole connected to the inner-layer circuit and the electric connecting pad.

10. The light emitting device of claim 9, wherein the second conductive hole is extended to the electric connecting pad from the inner-layer circuit in the base.

11. The light emitting device of claim 7, wherein the first light emitting unit and the second light emitting unit are electrically coupled to each other through the inner-layer circuit.

12. The light emitting device of claim 1, further comprising two first conductive holes separated by a first distance, and two second conductive holes separated by a second distance, wherein the second distance is greater than the first distance.

13. The light emitting device of claim 1, wherein the light emitting device is configured to emit light having a color temperature from 2700K to 4000K.

14. The light emitting device of claim 1, wherein the central slot, the first side slot, and the second side slot collectively have an area greater than 50% of that of the base in a top view.

15. The light emitting device of claim 1, wherein the central slot has a shorter side, and a longer side by which the first side slot is arranged.

16. The light emitting device of claim 1, wherein the first light emitting unit is greater than the second light emitting unit in size.

17. The light emitting device of claim 1, wherein the first side slot has a straight edge near the central slot, and a curved edge distant from the straight edge.

18. The light emitting device of claim 1, further comprising a third side slot and a forth side slot, wherein the central slot are surrounded by the first, second, third, and forth side slots from different sides.

19. The light emitting device of claim 1, wherein the central slot is arranged between the first side slot and the second side slot.

20. The light emitting device of claim 1, further comprising a third light emitting unit installed in the central slot, wherein the first light emitting unit and the third light emitting unit are configured to emit a same color light.

* * * * *